United States Patent
Do et al.

(10) Patent No.: US 7,927,498 B2
(45) Date of Patent: Apr. 19, 2011

(54) SOLAR CELL AND METHOD OF TEXTURING SOLAR CELL

(75) Inventors: Younggu Do, Seoul (KR); Junyong Ahn, Seoul (KR); Gyeayoung Kwag, Seoul (KR)

(73) Assignee: LG Electronics Inc., Seoul (KR)

( * ) Notice: Subject to any disclaimer, the term of this patent is extended or adjusted under 35 U.S.C. 154(b) by 131 days.

(21) Appl. No.: 12/371,417

(22) Filed: Feb. 13, 2009

(65) Prior Publication Data

US 2009/0199898 A1 Aug. 13, 2009

(30) Foreign Application Priority Data

Feb. 13, 2008 (KR) .................. 10-2008-0013053

(51) Int. Cl.
*B29D 11/00* (2006.01)
(52) U.S. Cl. .......... 216/24; 438/678; 438/745; 438/749; 438/750; 438/754
(58) Field of Classification Search .................. 216/37, 216/67, 74, 78; 438/678, 745, 749, 753; 136/248, 252
See application file for complete search history.

(56) References Cited

U.S. PATENT DOCUMENTS

| 4,229,233 | A | * | 10/1980 | Hansen et al. | 438/71 |
| 7,135,414 | B2 | * | 11/2006 | Matsumura et al. | 438/745 |
| 2004/0063326 | A1 | * | 4/2004 | Szlufcik et al. | 438/695 |
| 2009/0107546 | A1 | * | 4/2009 | Allison et al. | 136/256 |

FOREIGN PATENT DOCUMENTS

| JP | 12-077692 | 3/2000 |
| JP | 18-332427 | 12/2006 |
| JP | 19-194485 | 8/2007 |
| JP | 19-250583 | 9/2007 |
| KR | 10-1998-0067094 | 10/1998 |

* cited by examiner

*Primary Examiner* — Lan Vinh
*Assistant Examiner* — Maki A Angadi
(74) *Attorney, Agent, or Firm* — Birch, Stewart, Kolasch & Birch, LLP

(57) ABSTRACT

A solar cell and a method of texturing a solar cell are disclosed. The method includes coating an ink containing metal particles on a surface of a substrate, drying the ink to attach the metal particles to the surface of the substrate, and differentially etching the surface of the substrate using the metal particles as a catalyst to form an uneven portion.

11 Claims, 3 Drawing Sheets

SOLAR CELL AND METHOD OF TEXTURING SOLAR CELL

This application claims the benefit of Korean Patent Application No. 10-2008-0013053 filed on Feb. 13, 2008, the entire contents of which is hereby incorporated by reference.

BACKGROUND

1. Field

This application relates to texturing a solar cell using metal particles.

2. Description of the Related Art

Recently, as existing energy sources such as petroleum and coal are expected to be depleted, interests in alternative energy sources for replacing the existing energy sources are increasing. Among the alternative energy sources, a solar energy has been particularly spotlighted because the solar energy has abundant energy sources and does not cause environmental pollution.

The solar energy may be classified into a solar heat energy that generates a vapor required to rotate a turbine using a solar heat and a solar light energy that converts photons into electric energy using properties of a semiconductor. The solar light energy is generally referred to as a solar cell.

The solar cell is manufactured by a p-n junction of a p-type semiconductor and an n-type semiconductor. Electrons flow from the n-type semiconductor to the p-type semiconductor by a photovoltaic effect to produce electricity.

To improve an energy conversion efficiency of the solar cell, resistances of a solar cell substrate and an electrode have to be lowered, and a recombination of carriers has to be reduced. At the same time, a reflectance of light incident on the solar cell substrate has to be lowered. Accordingly, a study for improving the energy conversion efficiency of the solar cell is being actively carried out.

SUMMARY

In one aspect, there is a method of texturing a solar cell comprising coating an ink containing metal particles on a surface of a substrate, drying the ink to attach the metal particles to the surface of the substrate, and differentially etching the surface of the substrate using the metal particles as a catalyst to form an uneven portion.

The ink may be coated on the substrate using one of a screen printing method, a spray coating method, and a spin coating method. The ink preferably includes nano-sized metal particles, $H_2O$, and polyvinylpyrrolidone (PVP). The method in an embodiment further comprises, after forming the uneven portion, removing the metal particles remaining after etching the surface of the substrate from the surface of the substrate.

The surface of the substrate preferably be etched using an etchant in which HF, $H_2O_2$ and $H_2O$ are mixed. A depth of the uneven portion may depend on a composition ratio of the etchant.

Each of the metal particles preferably have a diameter of 100 nm to 300 nm. The metal particles may be formed of one of Au, Ag, Cu, Al, Pt, and Pd, or a combination thereof.

The metal particles preferably be removed using an aqueous solution obtained by mixing iodine (I) with potassium iodine (KI) in case the remaining metal particles are formed of Au, using nitrate-based ($NO_{32}-$) aqueous solution in case the remaining metal particles are formed of Ag, using one of bromide-based, chloride-based, nitrate-based, and sulfate-based aqueous solutions or a mixed aqueous solution thereof in case the remaining metal particles are formed of Cu, using an aqueous solution obtained by mixing H2SO4 with HNO3 in case the remaining metal particles are formed of Al, using one of chloride-based and nitrate-based aqueous solutions or a mixed aqueous solution thereof in case the remaining metal particles are formed of Pt or Pd.

In another aspect, there is a solar cell comprising a first conductive type substrate having a surface on which an uneven portion having a size of 200 nm to 400 nm is formed, a doping unit on the substrate, the doping unit including impurities of a conductive type opposite the first conductive type, a first electrode on the substrate, and a second electrode on the doping unit.

In a solar cell according to embodiments, a surface of a substrate can be simply textured by wet etching the substrate using a metal catalyst, and an efficiency of the solar cell by reducing a reflectance of light incident on the substrate can be improved.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

Figure 1:
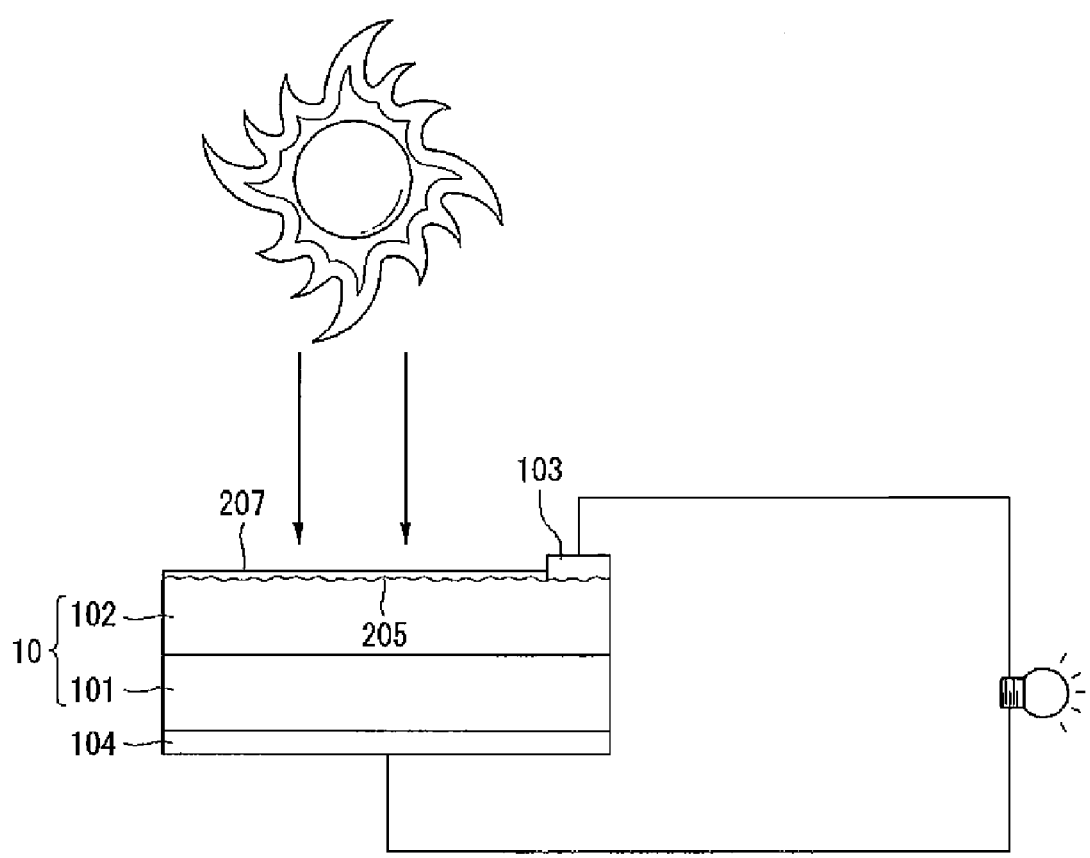
FIG. 1 schematically illustrates an exemplary structure of a solar cell according to an embodiment.

FIG. 1 schematically illustrates an exemplary structure of a solar cell according to an embodiment.

As shown in FIG. 1, a substrate 10 is formed by a junction of a first conductive type (for example, p-type) semiconductor 101 and a second conductive type (opposite the second conductive type, for example, n-type) semiconductor 102. The second conductive type semiconductor 102 is formed by doping the surface of the first conductive type semiconductor 101 with second conductive type impurities. The first conductive type semiconductor 101 is a semiconductor substrate doped with first conductive type impurities.

Electrodes 103 and 104 are respectively formed on the two semiconductors 102 and 101 and are electrically connected to the two semiconductors 102 and 101, respectively. Hence, when light is incident on the substrate 10, electrons resulting from a photovoltaic effect in the second conductive type semiconductor 102 flow to the first conductive type semiconductor 101 through the electrode 103 to produce electricity.

The surface of the second conductive type semiconductor 102 is textured by closely forming uneven portions 205 each having the size of approximately 200 nm to 400 nm on the surface of the second conductive type semiconductor 102 on which the light is incident. The closely formed uneven portions 205 prevent the light from being reflected by the substrate 10 and allow a traveling path of the light on the substrate 10 to lengthen. The uneven portions 205 are preferably formed on the entire surface of the second conductive type semiconductor 102 on which the light is incident. In this case, the electrode 103 is formed on the uneven portions 205. FIG. 1 shows the electrode 103 formed on the uneven portions 205.

An anti-reflective layer 207 is formed on the second conductive type semiconductor 102, on which the uneven portions 205 are formed, to cover the uneven portions 205. The anti-reflective layer 207 prevents the light from being reflected by the substrate 10. Namely, the uneven portions 205 and the anti-reflective layer 207 effectively prevent a loss of the light incident on the substrate 10. The anti-reflective layer 207 is formed of silicon nitride (SiNx) or silicon oxide ($SiO_2$). Other materials may be used for the anti-reflective layer 207.

Figure 2:
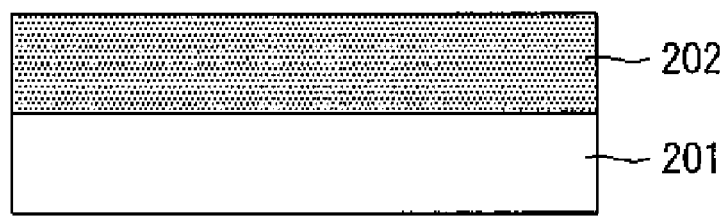
FIG. 2 illustrates a substrate formed by a p-n junction.
Figure 3:
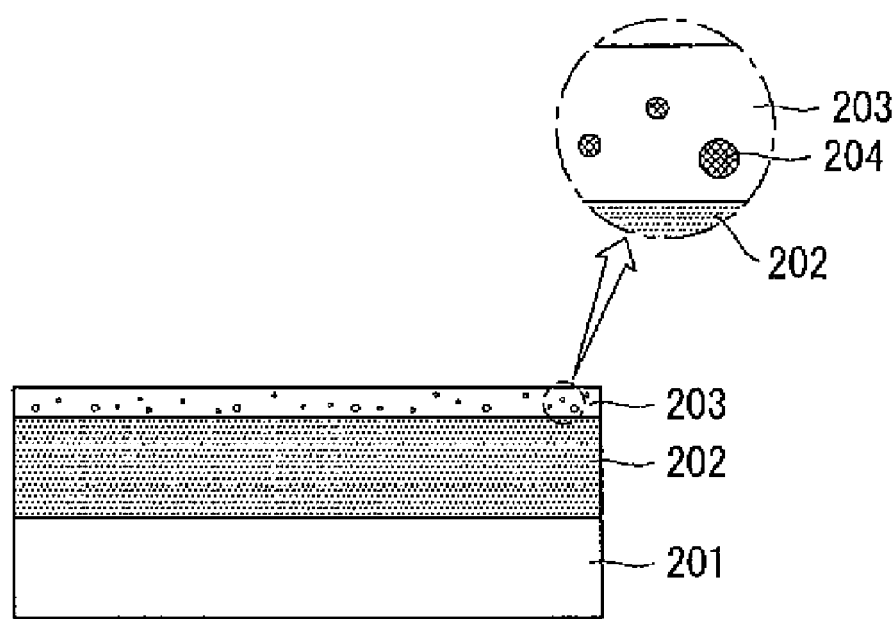
FIG. 3 illustrates a coating of an ink containing metal particles on the surface of a substrate.
Figure 4:
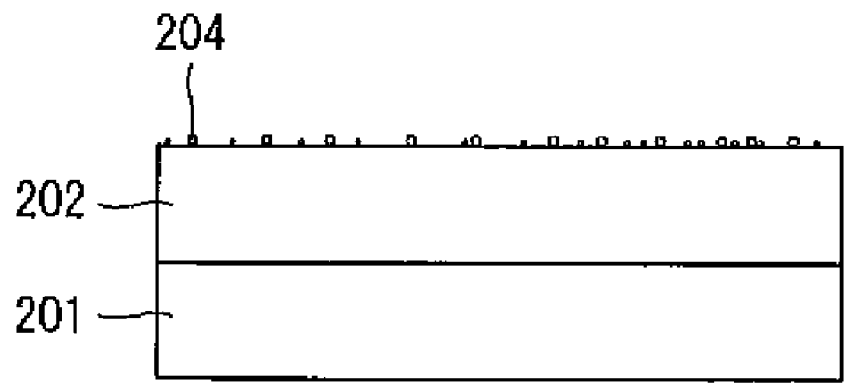
FIG. 4 illustrates metal particles attached to a substrate.

FIGS. 2 to 4 are cross-sectional views sequentially illustrating each of stages in a method of texturing the surface of a substrate using metal particles as a catalyst.

As shown in FIG. 2, second conductive type impurities are injected into the surface of a substrate 201 doped with first conductive type impurities to form an emitter layer 202. Hence, a p-n junction is formed on the substrate 201. In the exemplary embodiment, the substrate 201 may include p-type and n-type substrates. The p-type substrate may be preferable to the n-type substrate because of long lifetime and great mobility of minority carriers that are electrons in the p-type substrate. An n-type emitter layer 202 is formed by doping a p-type silicon substrate with a group V element such as P, As and Sb. Hence, a p-n junction is formed.

Next, as shown in FIGS. 3 and 4, an ink 203 containing metal particles 204 is uniformly coated on the surface of the emitter layer 202. The ink 203 includes a mixture of the nano-sized metal particles 204, $H_2O$, and polyvinylpyrrolidone (PVP) being a surfactant.

The ink 203 is coated on the surface of the emitter layer 202 using various methods such as a screen printing method, a spray coating method, and a spin coating method. A drying process is performed on the coated ink 203 for a predetermined period of time. In the drying process, the metal particles 204 contained in the ink 203 are precipitated in a gravity direction, and a mixture of $H_2O$ and the surfactant except the metal particles 204 is vaporized. Therefore, only the metal particles 204 remain on the surface of the emitter layer 202. The metal particles 204 may be formed of one of Au, Ag, Cu, Al, Pt, and Pd, or a combination thereof. A diameter of the metal particles 204 may be approximately 100 nm to 300 nm.

The surface of the emitter layer 202 is wet etched in a state where the metal particles 204 are attached to the surface of the emitter layer 202. During the wet etching, the nano-sized uneven portions 205 are closely formed on the surface of the emitter layer 202 to which the metal particles 204 are attached. More specifically, during the wet etching, the metal particles 204 on the surface of the emitter layer 202 generate a catalytic action, and thus an etching operation in an attached portion of the metal particles 204 is performed rapidly than an etching operation in a non-attached portion of the metal particles 204. Hence, the uneven portions 205 are formed on the surface of the emitter layer 202 because of a difference between etch rates of the attached portion and the non-attached portion of the metal particles 204, and the surface of the emitter layer 202 is textured. Because the diameter of the metal particles 204 is approximately 100 nm to 300 nm, the uneven portions 205 has the size of approximately 200 nm to 400 nm slightly greater than the diameter of the metal particles 204. The following Reaction Formula 1 indicates a reaction mechanism of the catalytic action of the metal particles 204 attached to the surface of the emitter layer 202.

[Reaction Formula 1]
Cathodic Reaction (Metal Particles)

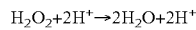

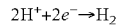

Anodic Reaction (Substrate Surface)

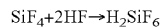

Total Reaction

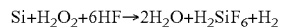

As indicated in the above Reaction Formula 1, the metal particles 204 accelerates a production of hydrogen ions ($H^+$) dissociated from $H_2O_2$ and relatively decelerates a production of hydrogen ($H_2$). A high concentration of hydrogen ion ($H^+$) accelerates a production of $SiF_4$ on the surface of the emitter layer 202 showing the anodic reaction to increase an etch rate of the surface of the emitter layer 202 to which the metal particles 204 are attached.

In a wet etching process for texturing the surface of the emitter layer 202, a wet etchant in which HF, $H_2O_2$ and $H_2O$ are mixed in a volume ratio of 1:5:10 may be used. A composition ratio of the wet etchant may be adjusted so as to control an etch rate. In other words, changes in the etch rate may cause changes in a depth of the uneven portions 205, and as a result may cause changes in a reflectance of the solar cell.

Figure 5:
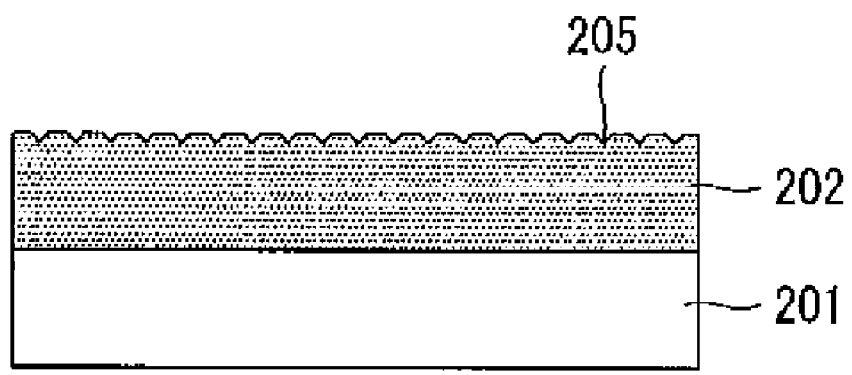
FIG. 5 illustrates uneven portions on the surface of a substrate.

Next, as shown in FIG. 5, after the texturing process on the surface of the emitter layer 202 using the ink 203 including the metal particles 204 is completed, it is preferable to remove the metal particles 204 remaining on the surface of the emitter layer 202 after the etching process.

An aqueous solution used to remove the remaining metal particles 204 may depend on a kind of metal particles 204. For example, in case the remaining metal particles 204 are formed of Au, an aqueous solution obtained by mixing iodine (I) with potassium iodine (KI) may be used. In case the remaining metal particles 204 are formed of Ag, nitrate-based ($NO_3^{2-}$) aqueous solution may be used. In case the remaining metal particles 204 are formed of Cu, one of bromide-based, chloride-based, nitrate-based, and sulfate-based aqueous solutions, or a mixed aqueous solution thereof may be used. In case the remaining metal particles 204 are formed of Al, an aqueous solution obtained by mixing $H_2SO_4$ with $HNO_3$ may be used. In case the remaining metal particles 204 are formed of Pt or Pd, one of chloride-based and nitrate-based aqueous solutions, or a mixed aqueous solution thereof may be used.

It is disclosed in the exemplary embodiment that the surface of the emitter layer 202 is textured by forming the emitter layer 202 and then coating the ink 203. However, the surface of the substrate of the solar cell may be textured as follows. More specifically, the surface of the substrate 201 may be textured by coating the ink 203 on the surface of the substrate 201, and then by sequentially performing drying and wet etching processes of the ink 203 and a process for removing the metal particles 202. Afterwards, the emitter layer 202 may be formed on the textured surface of the substrate 201.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of texturing a surface of a substrate for a solar cell comprising:
    coating an ink containing metal particles on the surface of the substrate;
    drying the ink to attach the metal particles to the surface of the substrate;
    wet etching the surface of the substrate using the metal particles as a catalyst to form an uneven portion; and
    after forming the uneven portion, removing the metal particles remaining after etching the surface of the substrate from the surface of the substrate,
    wherein the removing of the metal particles includes using an aqueous solution obtained by mixing iodine (I) with potassium iodine (KI) in case the remaining metal particles are formed of Au,
    wherein the removing of the metal particles includes using nitrate-based ($NO_3^{2-}$) aqueous solution in case the remaining metal particles are formed of Ag,
    wherein the removing of the metal particles includes using one of bromide-based, chloride-based, nitrate-based, and sulfate-based aqueous solutions, or a mixed aqueous solution thereof in case the remaining metal particles are formed of Cu,
    wherein the removing of the metal particles includes using an aqueous solution obtained by mixing $H_2SO_4$ with $HNO_3$ in case the remaining metal particles are formed of Al,
    wherein removing the metal particles includes using one of chloride-based and nitrate-based aqueous solutions, or a mixed aqueous solution thereof in case the remaining metal particles are formed of Pt or Pd.

2. The method of claim 1, wherein the coating of the ink includes using one of a screen printing method, a spray coating method, and a spin coating method.

3. The method of claim 1, wherein the etching of the surface of the substrate includes performing a wet etching process using an etchant in which HF, $H_2O_2$ and $H_2O$ are mixed.

4. The method of claim 3, wherein a depth of the uneven portion depends on a composition ratio of the etchant.

5. The method of claim 1, wherein the ink includes nano-sized metal particles, $H_2O$, and polyvinylpyrrolidone (PVP).

6. The method of claim 5, wherein each of the metal particles has a diameter of 100 nm to 300 nm.

7. The method of claim 1, wherein the metal particles are formed of one of Au, Ag, Cu, Al, Pt, and Pd, or a combination thereof.

8. The method of claim 1, further comprising, before coating the ink on the surface of the substrate, injecting impurities of a conductive type opposite a conductive type of the substrate into the surface of the substrate.

9. The method of claim 1, further comprising, after etching the surface of the substrate, injecting impurities of a conductive type opposite a conductive type of the substrate into the surface of the substrate.

10. A method of forming a solar cell, the method comprising:
    forming an emitter at a surface of a semiconductor substrate;
    coating an ink containing metal particles on a surface of the emitter;
    drying the ink to attach the metal particles on the surface of the semiconductor substrate;
    wet etching the semiconductor substrate using the metal particles as a catalyst to form an uneven portion; and
    removing the metal particles remaining from the surface of the semiconductor substrate.

11. A method of forming a solar cell, the method comprising:
    coating an ink containing metal particles on a surface of a semiconductor substrate;
    drying the ink to attach the metal particles on the surface of the semiconductor substrate;
    wet etching the semiconductor substrate using the metal particles as a catalyst to form an uneven portion;
    removing the metal particles remaining from the surface of the semiconductor substrate; and
    forming an emitter at the uneven portion of the semiconductor substrate.

* * * * *